(12) United States Patent
Lu et al.

(10) Patent No.: US 11,657,640 B2
(45) Date of Patent: May 23, 2023

(54) DISPLAY PANEL AND DISPLAY DEVICE HAVING IMAGING APERTURE FORMED ON COLOR FILTER LAYER

(71) Applicant: Shanghai Tianma Micro-Electronics Co., Ltd., Shanghai (CN)

(72) Inventors: Feng Lu, Shanghai (CN); Yang Zeng, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 28 days.

(21) Appl. No.: 16/911,196

(22) Filed: Jun. 24, 2020

(65) Prior Publication Data
US 2021/0397806 A1 Dec. 23, 2021

(30) Foreign Application Priority Data
Mar. 4, 2020 (CN) .......................... 202010142721.1

(51) Int. Cl.
*G06V 40/13* (2022.01)
*G06F 3/044* (2006.01)
(Continued)

(52) U.S. Cl.
CPC ........ *G06V 40/1318* (2022.01); *G06F 3/0443* (2019.05); *H01L 27/322* (2013.01);
(Continued)

(58) Field of Classification Search
CPC ..... G06K 9/0004; G06F 3/042; G06F 3/0421; G09G 2360/14; G09G 2360/142;
(Continued)

(56) References Cited

U.S. PATENT DOCUMENTS

| 2002/0044208 A1* | 4/2002 | Yamazaki | H01L 27/3269 348/272 |
| 2006/0221027 A1* | 10/2006 | Ishihara | G02F 1/133512 345/88 |
| 2008/0122804 A1* | 5/2008 | Kinoshita | G06F 1/3262 345/175 |
| 2012/0287085 A1* | 11/2012 | Yuki | G06F 3/0412 345/175 |

(Continued)

FOREIGN PATENT DOCUMENTS

| CN | 107221602 A | 9/2017 |
| CN | 109343735 A | 2/2019 |

(Continued)

*Primary Examiner* — Yuzhen Shen
(74) *Attorney, Agent, or Firm* — Alston & Bird LLP

(57) ABSTRACT

Provided are a display panel and a display device. An array layer is located on a substrate. A display layer is located on a side of the array layer facing away from the substrate and includes light-emitting elements. A color filter layer is located on a side of the display layer facing away from the array layer. The color filter layer includes a light-blocking layer and color filters. The light-blocking layer includes first light-blocking portions. Each first light-blocking portion forms an imaging aperture. A protective layer is located on the color filter layer. Each first metal part overlaps the first light-blocking portion. The optical sensor layer is located on a side of the color filter layer facing away from the protective layer and configured to detect an image formed by the imaging aperture. Further provided is a display device including the preceding display panel.

20 Claims, 13 Drawing Sheets

(51) Int. Cl.
    *H01L 27/32* (2006.01)
    *H01L 51/52* (2006.01)
    *H01L 27/146* (2006.01)
(52) U.S. Cl.
    CPC ........ *H01L 27/323* (2013.01); *H01L 27/3234* (2013.01); *H01L 27/3244* (2013.01); *H01L 51/5284* (2013.01); *G06F 2203/04112* (2013.01); *H01L 27/14678* (2013.01)

(58) Field of Classification Search
    CPC ........ G09G 2360/148; G02F 1/133514; G02F 1/136222; G02F 1/133512; G02F 1/136209; G02B 5/201; H01L 29/78633; H01L 27/14623
    See application file for complete search history.

(56) References Cited

U.S. PATENT DOCUMENTS

| | | | | |
|---|---|---|---|---|
| 2018/0182819 | A1* | 6/2018 | Jo | G06F 3/0412 |
| 2020/0066804 | A1* | 2/2020 | Jung | H01L 51/5284 |
| 2020/0133414 | A1* | 4/2020 | Lee | G06F 3/044 |
| 2021/0026473 | A1* | 1/2021 | Kim | G06F 3/04164 |
| 2021/0096678 | A1* | 4/2021 | Kubota | G06F 3/042 |
| 2021/0104583 | A1* | 4/2021 | Jeon | G06F 1/1637 |
| 2021/0110131 | A1* | 4/2021 | Lin | H01L 27/14621 |
| 2021/0167144 | A1* | 6/2021 | Lim | H01L 27/3234 |
| 2021/0249635 | A1* | 8/2021 | Cho | G06F 3/0412 |

FOREIGN PATENT DOCUMENTS

| | | |
|---|---|---|
| CN | 110061042 A | 7/2019 |
| CN | 110286717 A | 9/2019 |
| JP | 2013232040 A | 11/2013 |

\* cited by examiner ered is fully conveyed to those skilled in the art. In the drawings, the thickness of regions and layers will be exaggerated for clarity. The same reference numbers in the drawings denote the same or similar structures, and their detailed description will be omitted.

DISPLAY PANEL AND DISPLAY DEVICE HAVING IMAGING APERTURE FORMED ON COLOR FILTER LAYER

CROSS-REFERENCE TO RELATED APPLICATION

This application claims priority to a Chinese patent application No. CN202010142721.1, entitled "Display Panel And Display Device" and filed on Mar. 4, 2020, the content of which is incorporated herein by reference in its entirety.

TECHNICAL FIELD

The present disclosure relates to the field of display technology, and in particular, to a display panel and a display device.

BACKGROUND

Everyone is characterized with fingerprints. With the development of science and technology, various display devices with fingerprint recognition functions, such as mobile phones, tablet computers and smart wearable devices, have appeared on the market. Before a user operates a display device with the fingerprint recognition function, the user can perform permission verification by simply touching the display device with a finger, so that the permission verification process is simplified. Moreover, with the gradual increase of the application scenarios of the fingerprint recognition function, the fingerprint recognition region gradually evolves from a partial region to a full screen.

In the related display device which is based on optical fingerprint recognition technology, an optical sensor is often formed on a semiconductor device in the display device. Fingerprint detection is implemented by using a feature that is when certain semiconductor device is exposed to light, the device may generate a leakage current. Specifically, after light generated by a fingerprint recognition light source is reflected on a surface where a finger touches the display device, the reflected light hits the optical sensor and the optical sensor detects the light intensity caused by the fluctuations of fingerprint valleys and peaks to generate a fingerprint image. However, the accuracy of fingerprint recognition in the related art needs to be further improved.

Therefore, how to improve the accuracy of fingerprint recognition on a display device needs to be solved.

SUMMARY

The present disclosure provides a display panel, including a substrate having a first surface and a second surface opposing the first surface, an array layer, a display layer, a color filter layer, a protective layer, first metal parts and an optical sensor layer. The array layer is disposed on the first surface of the substrate, and the display layer is disposed on a side of the array layer facing away from the substrate and includes light-emitting elements. The color filter layer is disposed on a side of the display layer facing away from the array layer. The color filter layer includes a light-blocking layer and color filters. The color filters are in correspondence with the light-emitting elements. The light-blocking layer includes first light-blocking portions, each forming an imaging aperture. The protective layer is disposed on the color filter layer. Each first metal part overlaps a respective first light-blocking portion of the light-blocking layer. The optical sensor layer is disposed on a side of the color filter layer facing away from the protective layer and configured to detect an image formed by the imaging aperture. The present disclosure further provides a display device including the display panel.

The benefit of the disclosed display device improves the imaging effect of the imaging aperture, enhances the quality of the imaging picture and increases the accuracy of the optical recognition.

DETAILED DESCRIPTION

Figure 1:
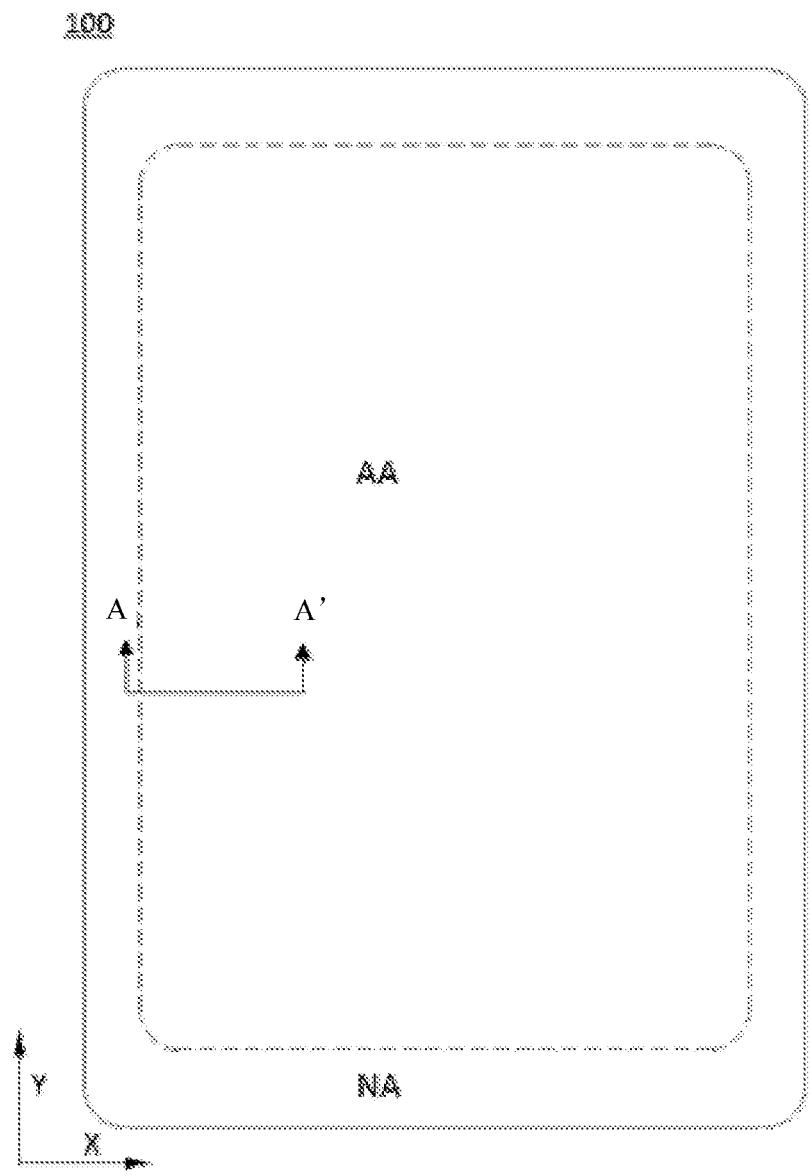
FIG. 1 is a top view of a display panel according to an embodiment of the present disclosure.

The present disclosure will be further described in conjunction with drawings and embodiments.

It should be noted that in the following description, details are described to provide a thorough understanding of the present disclosure. The present disclosure can, however, be implemented in various other manners than those described herein and those skilled in the art may make similar generalizations without departing from the meaning of the present disclosure. Therefore, the present disclosure is not limited by the embodiments disclosed below.

The terminology used in embodiments of the present disclosure is for describing specific embodiments only and is not intended to limit the present disclosure. As used in the present disclosure and the appended claims, singular forms "a, an" and "the" are also intended to include plural forms unless the context clearly indicates other meanings.

It should be noted that directional terms such as "upper", "lower", "left" and "right" described in embodiments of the present disclosure are described at the angle shown in the drawings and should not be construed as limiting the present disclosure. Further, in the context, it should be understood that when an element is referred to be formed "on" or "under" another element, the element can be formed not only directly "on" or "under" another element, but the element is also possible to be formed indirectly "on" or "under" another element through an intermediate element.

Moreover, example embodiments can be implemented in various manners and should not be construed as being limited to the embodiments provided herein. Rather, these embodiments are provided so that the present disclosure is more thorough and complete and the concept of the example embodiments is fully conveyed to those skilled in the art. In the drawings, the same reference numerals denote the same or similar structures, and thus a repeated description of the same reference numerals will be omitted. Words denoting positions and orientations described in the present disclosure are illustrated by examples of drawings, but changes may be made as required, and the changes are contained within the scope of the present disclosure. The drawings of the present disclosure are only used for illustrating relative positional relationships, the layer thicknesses at certain locations have been drawn exaggeratedly to facilitate understanding, and the layer thicknesses in the drawings do not represent proportional relationships of the actual layer thicknesses. Moreover, if not in conflict, embodiments of the present disclosure and features thereof may be combined with each other. The drawings of embodiments of the present application have the same reference numerals. Further, similarities between the embodiments are not repeated here.

Figure 2:
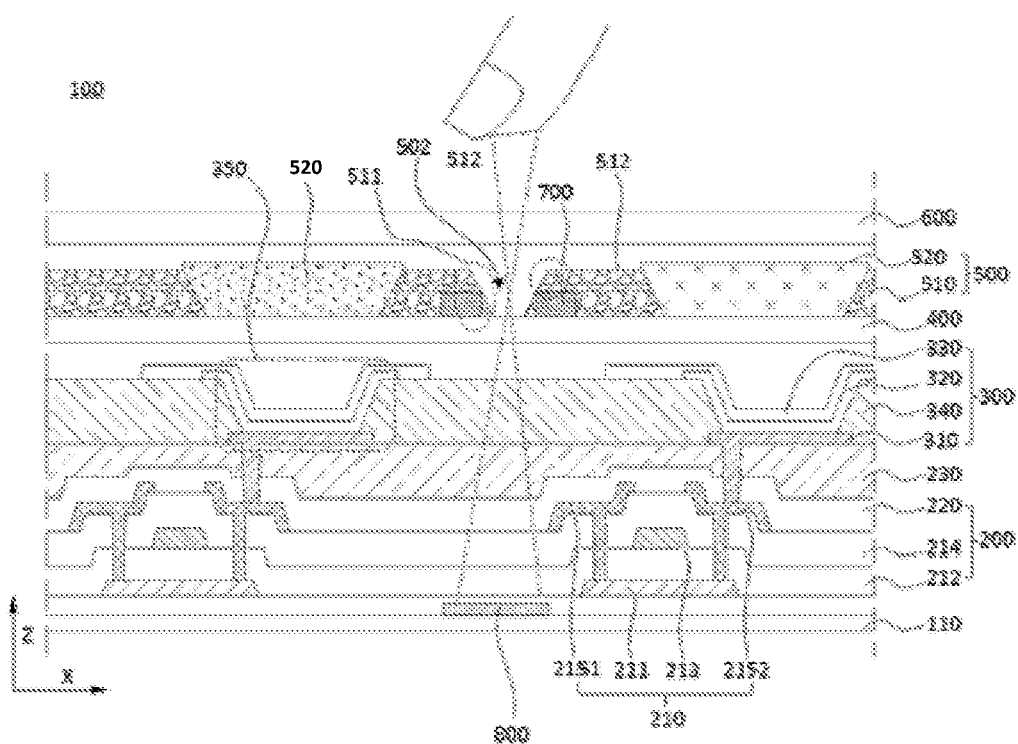
FIG. 2 is a partial cross sectional view taken along A-A' of FIG. 1.

FIG. 1 is a top view of a display panel according to an embodiment of the present disclosure. FIG. 2 is a partial cross sectional view taken along A-A' of FIG. 1, and the cross section shows the device in a perpendicular view to the plane where the display panel is located.

In FIG. 1, the display panel 100 is divided into a display region AA and a non-display region NA surrounding the display region AA. It should be understood that a dotted box in FIG. 1 is used for illustrating a boundary between the display region AA and the non-display region NA. The display region AA is a region of the display panel for displaying images. The display region AA typically includes pixel units arranged in an array. Each pixel unit includes a light-emitting element (for example, a diode) and a control element (for example, a thin-film transistor constituting a pixel driving circuit) corresponding to the pixel unit. The non-display region NA surrounds the display region AA and typically includes a peripheral drive element, peripheral wiring and a fan-out region.

The display panel 100 includes a substrate 110. The substrate 110 (that is, the substrate base) may be flexible and thus extensible, collapsible, bendable or rollable, so that the flexible display panel may be extensible, collapsible, bendable or rollable. The substrate 110 may be formed by any suitable insulating material with flexibility. The substrate 110 is used for blocking oxygen and moisture, preventing diffusion of moisture or impurities through the flexible substrate, and providing a flat surface on an upper surface of the flexible substrate. For example, the substrate 110 may be formed by a polymer material such as polyimide (PI), polycarbonate (PC), polyether sulfone (PES), polyethylene terephthalate (PET), polyethylene naphthalate (PEN), polyarylate (PAR) or glass fiber reinforced plastic (FRP). The substrate 110 may be transparent, translucent or opaque. In an embodiment, the display panel may further include a buffer layer (not shown) on the substrate 110, and the buffer layer may cover the entire upper surface of the substrate 110.

The display panel 100 further includes an array layer 200 located on the substrate 110. The array layer 200 is located on a side of the substrate 110 facing toward a display surface or touch surface of the display panel 100. The array layer 200 may include multiple thin film transistors (TFTs) 210 and a pixel circuit constituted by the TFTs. The pixel circuit is used for controlling light-emitting elements in the display layer.

This embodiment utilizes top-gate thin film transistors as an example to illustrate the structure. A thin film transistor layer 210 includes an active layer 211 located on the substrate 110. The active layer 211 may include a material such as amorphous silicon, polysilicon or metal oxide. When the active layer 211 is the polysilicon material, it may be made by the technology of low temperature amorphous silicon, that is, the amorphous silicon material is melted by a laser and deposited to form the polysilicon material. Moreover, various methods such as a rapid thermal annealing (RTA) method, a solid phase crystallization (SPC) method, an excimer-laser annealing (ELA) method, a metal induced crystallization (MIC) method, a metal induced lateral crystallization (MILC) method or a sequential lateral solidification (SLS) method may be used. The active layer 211 further includes a source region and a drain region formed by doping N-type impurity ions or P-type impurity ions, and a channel region formed between the source region and the drain region.

The display panel 100 further includes a gate insulating layer 212 located on the active layer 211. The gate insulating layer 212 includes an inorganic layer such as silicon oxide or silicon nitride, and may include a single layer or multiple layers.

The display panel 100 further includes gates 213 located on the gate insulating layer 212. The gate 213 may include a single layer or multiple layers made from metal such as gold (Au), silver (Ag), copper (Cu), nickel (Ni), platinum (Pt), palladium (Pd), aluminum (Al), molybdenum (Mo) or chromium (Cr), or made from alloy such as aluminum (Al): neodymium (Nd) alloy and molybdenum (Mo): tungsten (W) alloy.

The display panel 100 further includes an interlayer insulating layer 214 located on the gates 213. The interlayer insulating layer 214 may be formed by an inorganic insulating material such as silicon oxide or silicon nitride. Of course, in other embodiments of the present disclosure, the interlayer insulating layer 214 may be made from an organic insulating material.

The display panel 100 further includes source electrodes 2151 and drain electrodes 2152 located on the interlayer insulating layer 214. The source electrode 2151 and drain electrode 2152 are electrically connected (or bonded) to the source region and the drain region respectively through contact holes, and the contact holes are formed by selectively removing the gate insulating layer 212 and the interlayer insulating layer 214.

The array layer 200 may further include a passivation layer 220. In an embodiment, the passivation layer 220 is located on the source electrodes 2151 and the drain electrodes 2152 of the thin film transistors 210. The passivation layer 220 may be made from an inorganic material such as silicon oxide or silicon nitride, or may be made from an organic material.

The display panel 100 may further include a second planarization layer 230. In an embodiment, the second planarization layer 230 is located on the passivation layer 220. The second planarization layer 230 includes an organic material such as acryl, PI, or benzocyclobutene (BCB). The second planarization layer 230 has a planarization function.

The display panel 100 further includes a display layer 300 located on a side of the array layer 200 facing away from the substrate 110. The display layer 300 includes light-emitting elements. In an embodiment, the display layer 300 is located on the second planarization layer 230. The display layer 300 includes anode layers 310, organic light-emitting materials 320, and cathode layers 330 sequentially disposed in a direction facing away from the substrate 110. The display layer 300 further includes a pixel definition layer 340 located on a side of the anode layers 310 facing away from the array layer 200. The pixel definition layer 340 may be made from an organic material such as PI, polyamide, BCB, acryl resin or phenolic resin, or made from an inorganic material such as SiNx.

In an embodiment, the anode layer 310 includes multiple anode patterns in one-to-one correspondence with the pixels, and the anode pattern in the anode layer 310 is connected to the source electrode 2151 or the drain electrode 2152 of the thin film transistor 210 through a via in the second planarization layer 230. The pixel definition layer 340 includes multiple openings exposing the anode layers 310, and the pixel definition layer 340 covers the edge of the patterns of the anode layers 310. The organic light-emitting material 320 at least partially fills the opening of the pixel definition layer 340 and contacts the anode layer 310.

In FIG. 2, the anode layer 310, the organic light-emitting material 320 and the cathode layer 330 defined by each opening of the pixel definition layer 340 constitute a light-emitting element 350 (that is shown in a dotted box), each light-emitting element 350 may emit light of different colors according to different organic light-emitting materials 320. Each light-emitting element 350 constitutes a pixel (or each light-emitting element and a pixel circuit controlling the light-emitting element jointly constitute a pixel), and multiple pixels jointly display an image.

The organic light-emitting materials 320 may be formed in the openings of the pixel definition layer 340 by the way of inkjet printing, nozzle printing or evaporation. The cathode layer 330 may be formed on the film of the organic light-emitting material 320 by evaporation. In an embodiment, the cathode layer 330 may also integrally cover the organic light-emitting material 320 and the pixel definition layer 340.

The display panel 100 further includes an encapsulation layer 400 located on the display layer 300 and the encapsulation layer 400 integrally covers the display layer 300 to seal the display layer 300. It should be understood that "on" mentioned in this embodiment may be understood as being "on a side facing away from the substrate 110". The he encapsulation layer 400 is a thin film encapsulation layer located on the cathode layers 330 and includes a first inorganic encapsulation layer, a first organic encapsulation layer and a second inorganic encapsulation layer sequentially arranged in the direction facing away from the substrate 110. Of course, in other embodiments of the present disclosure, the encapsulation layer 400 may include any number of stacked organic and inorganic materials as required, but include at least one layer of organic material and at least one layer of inorganic material deposited alternately, and the lowermost layer and uppermost layer are made from inorganic materials.

The display panel 100 further includes a color filter layer 500 located on a side of the display layer 300 facing away from the array layer 200. The color filter layer 500 includes a light-blocking layer 510 and color filters 520.

Figure 3:
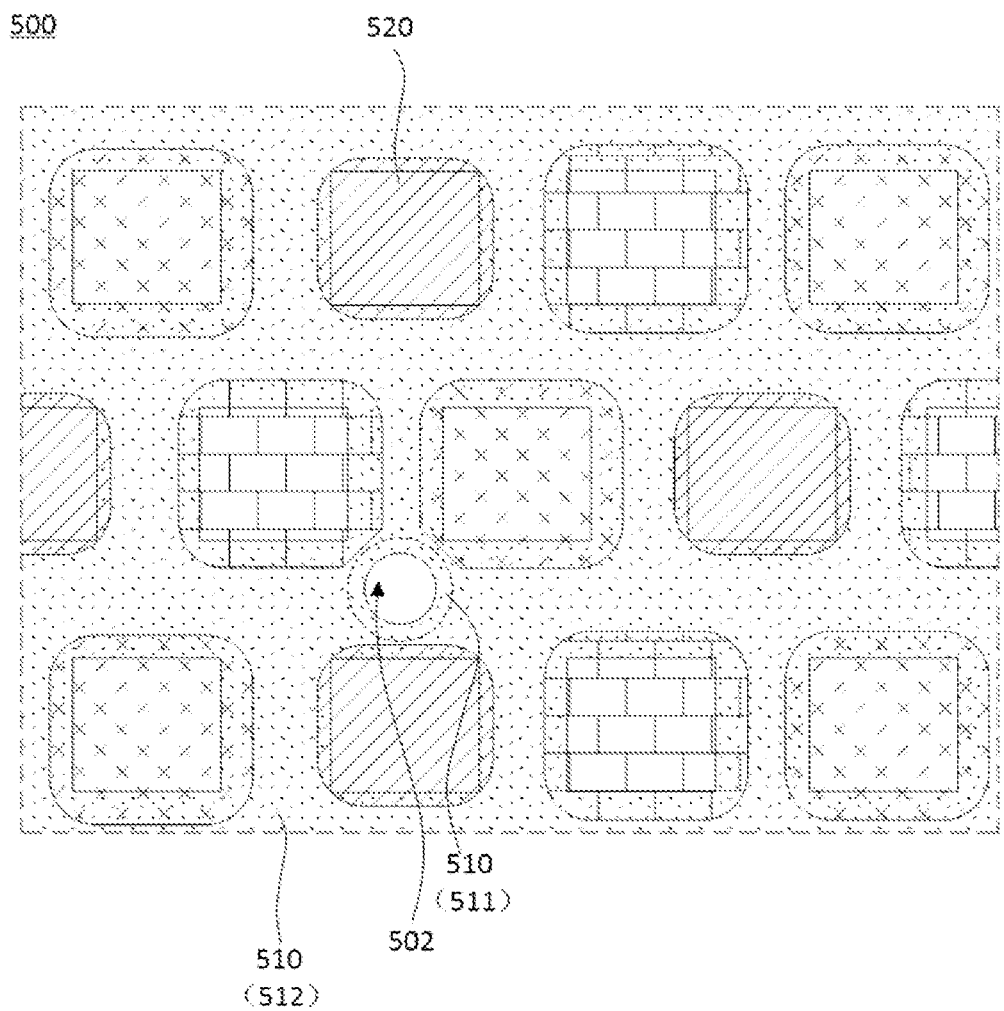
FIG. 3 is a top view of a color filter layer of a display panel according to an embodiment of the present disclosure.

FIG. 3 shows a top view of a color filter layer of the display panel according to the embodiment of the present disclosure. The region filled with dot patterns is the region covered by the light-blocking layer 510, and the region encircled by the rounded rectangle is the region covered by the color filters 520.

The light-blocking layer 510 is a black matrix (BM). The light-blocking layer 510 may be a grid structure, meshes of the grid are disposed in correspondence with the light-emitting elements 350, and one mesh defines one color filter 520. The color filters 520 with different colors are separated by the light-blocking layer 510. The color filters 520 are in one-to-one correspondence with the light-emitting elements 350. The color filters 520 include color filters with different colors, and the color filter 520 and the light-emitting element 350 corresponding to each other are in the same color.

It should be noted that the correspondence between two elements here may be understood as orthographic projections of the two elements overlapping on the substrate.

The display panel 100 may further include a protective layer 600 located on the color filter layer 500. In an embodiment, the protective layer 600 is the outermost film of the display panel 100 and may be a protective cover or a cover film. The protective layer 600 may be adhered to an adjacent film inside the display panel 100 by an optically clear adhesive (OCA).

The light-blocking layer 510 includes first light-blocking portions 511 (the regions encircled by the dotted circle in FIG. 2 and FIG. 3), and the first light-blocking portion 511 forms an imaging aperture 502.

The display panel 100 further includes first metal parts 700, and the first metal part 700 overlaps at least the first light-blocking portion 511 of the light-blocking layer 510.

In other words, the first metal part 700 overlaps at least the edge of the light-blocking layer 510 at the imaging aperture 502, does not overlap the imaging aperture 502, and does not cover the imaging aperture 502. It should be understood that the overlapping described here may be a direct contact overlapping.

The display panel 100 further includes an optical sensor layer 800 located on a side of the color filter layer 500 facing away from the protective layer 600 and configured to detect an image formed by the imaging aperture 502.

It should be understood that the case where one film is located on a side of another film includes the case where the two films are in contact and the case where the two films are in non-contact. The case of non-contact includes the case where the two films are spaced apart by a certain distance, and the case where other films are spaced apart between the two films.

The imaging effect of the imaging aperture 502 can be improved, the quality of imaging pictures can be enhanced, and the accuracy of the optical recognition can be increased. The imaging aperture 502 is formed through the first light-blocking portions 511 of the light-blocking layer 510 of the color filter layer 500, so that an additional light-blocking layer for fingerprint recognition imaging does not need to be added, which is advantageous for thinning. Meanwhile, in combination with the design that the first metal part 700 overlaps at least the region of the light-blocking layer 510 surrounding the imaging aperture 502, the blocking effect of the light-blocking layer 510 is consolidated to make the edge of the image presented by the imaging aperture 502 clearer and more definite.

The first metal part 700 is located on the lower side of the light-blocking layer 510, so that the light reflection of the first metal part 700 and pattern visibility can be avoided while the definition and accuracy of pinhole imaging are increased.

The light-blocking layer 510 further includes a second light-blocking portion 512, and the first light-blocking portion 511 is located between the second light-blocking portion 512 and the imaging aperture 502.

The thickness of the second light-blocking portion 512 is greater than the thickness of first light-blocking portion 511. It should be understood that the thickness described here is the dimension of the light-blocking layer 510 in a direction perpendicular to the substrate 110 (that is the Z-direction in FIG. 2).

The light-blocking layer 510 is made from an organic material. The light-blocking layer 510 made from the organic material is easy to pattern, easy to manufacture, has a good film-forming effect, and has a wide selection of materials.

Moreover, to have a good light-blocking effect or an effect of separating the color filters, the thickness of the light-blocking layer 510 is large. The organic material is easier to make a light-blocking layer with a large thickness and a small stress.

Moreover, to ensure that the imaging aperture 502 penetrates through the light-blocking layer 510, sufficient patterning is needed. Due to different patterning intensities of different depth positions of the light-blocking layer 510 (for example, taking time as an example, different depth positions have different exposure levels, etch rates and the like), the side wall of the imaging aperture 502 formed by the light-blocking layer 510 may be imaged to a slope.

The region covered by the slope is the region where the first light-blocking portion 511 is located. The thickness of the region is smaller than the thickness of the second light-blocking portion 512. The thickness of the first light-blocking portion 511 is thin, so that the blocking performance is poor, and the edge of the image presented by the imaging aperture is blurred or interfered.

That is, only the aperture of the light-blocking layer 510 is used as the imaging aperture 502. Because the light-blocking layer 510 is made from an organic material, has a small edge angle and an OD value of a large region may be low, a real image formed by the aperture actually has larger "halo", and the imaging effect is influenced.

The imaging effect of the imaging aperture can be improved, the quality of the imaging picture can be enhanced, and the accuracy of the optical recognition can be increased. The imaging aperture 502 is formed through the first light-blocking portions 511 of the light-blocking layer 510 of the color filter layer 500, so that an additional light-blocking layer for fingerprint recognition imaging does not need to be added, which is advantageous for thinning. Meanwhile, in combination with the design that the first metal part 700 overlaps at least the region of the light-blocking layer 510 surrounding the imaging aperture 502, the blocking effect of the light-blocking layer is consolidated to make the edge of the image presented by the imaging aperture 502 clearer and more definite. Moreover, the light transmission at the edge of the imaging aperture caused by the thin light-blocking layer and insufficient blocking is improved, and the image quality is enhanced, while the performance of the light-blocking layer in the color filter layer and the manufacturing yield of the imaging aperture are ensured.

Figure 4:
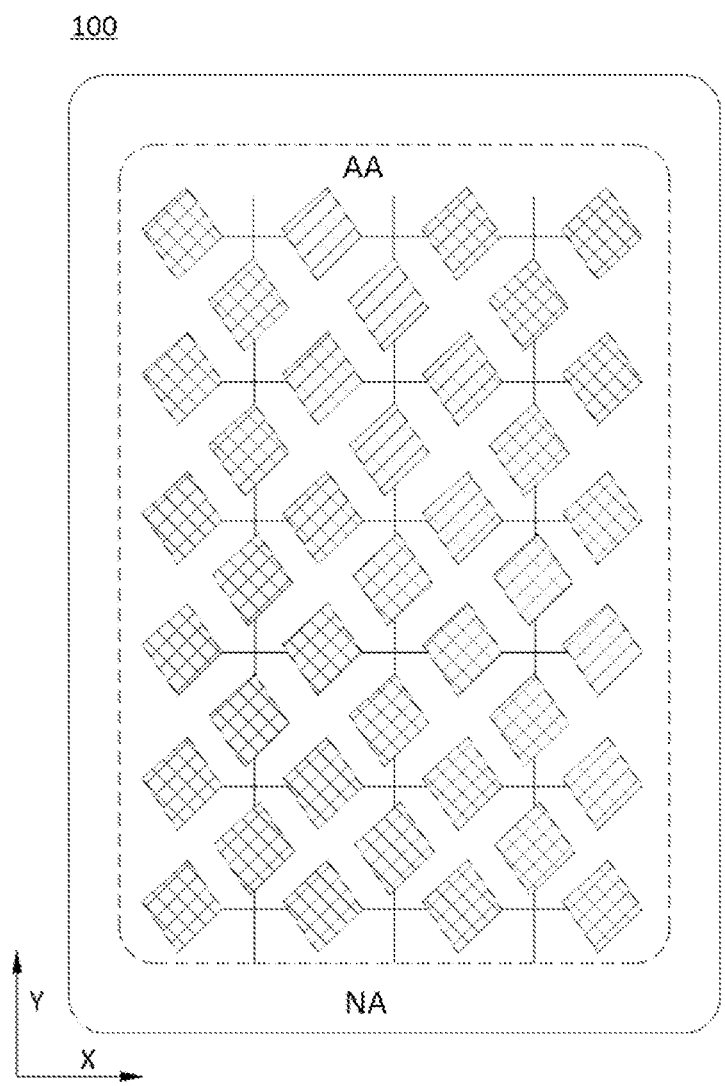
FIG. 4 is a top view of another display panel according to an embodiment of the present disclosure.
Figure 5:
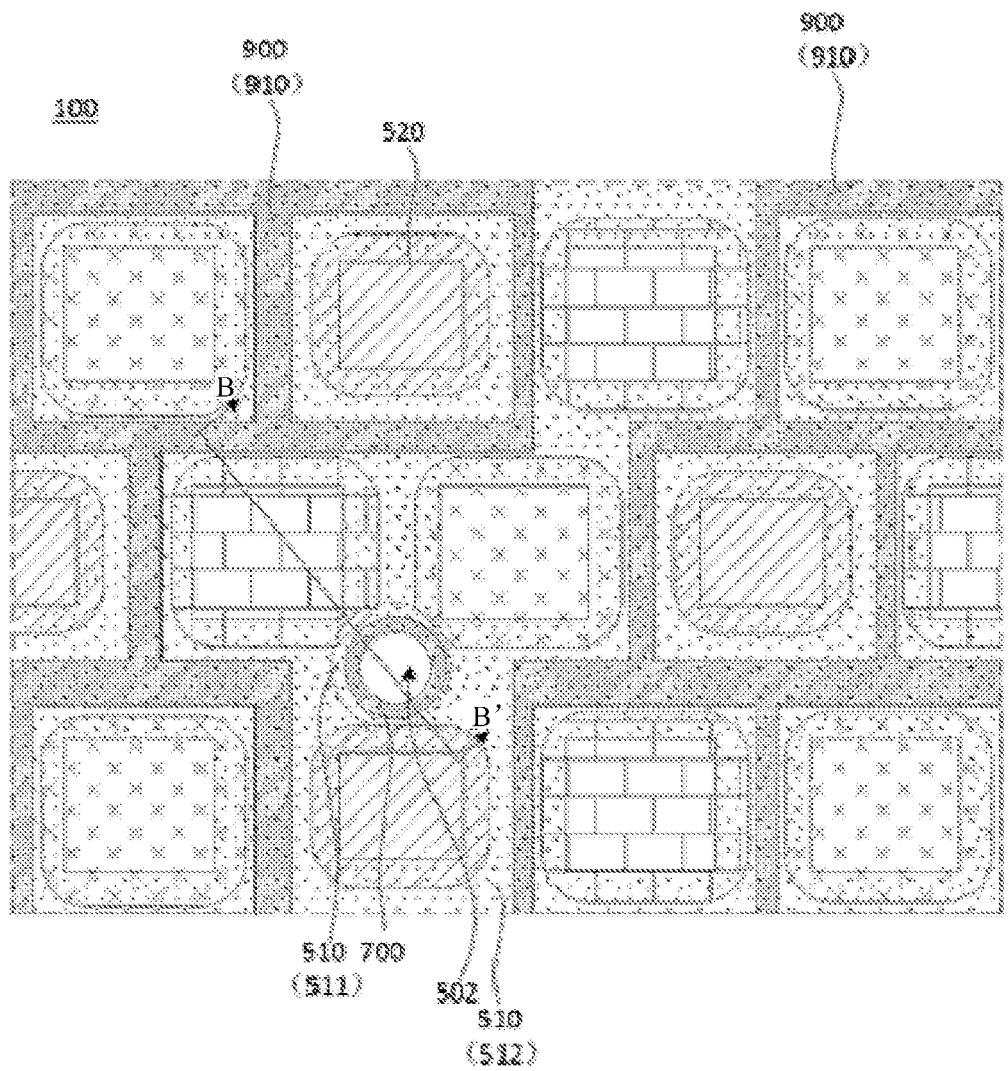
FIG. 5 is a partial enlarged view of the display panel of FIG. 4.
Figure 6:
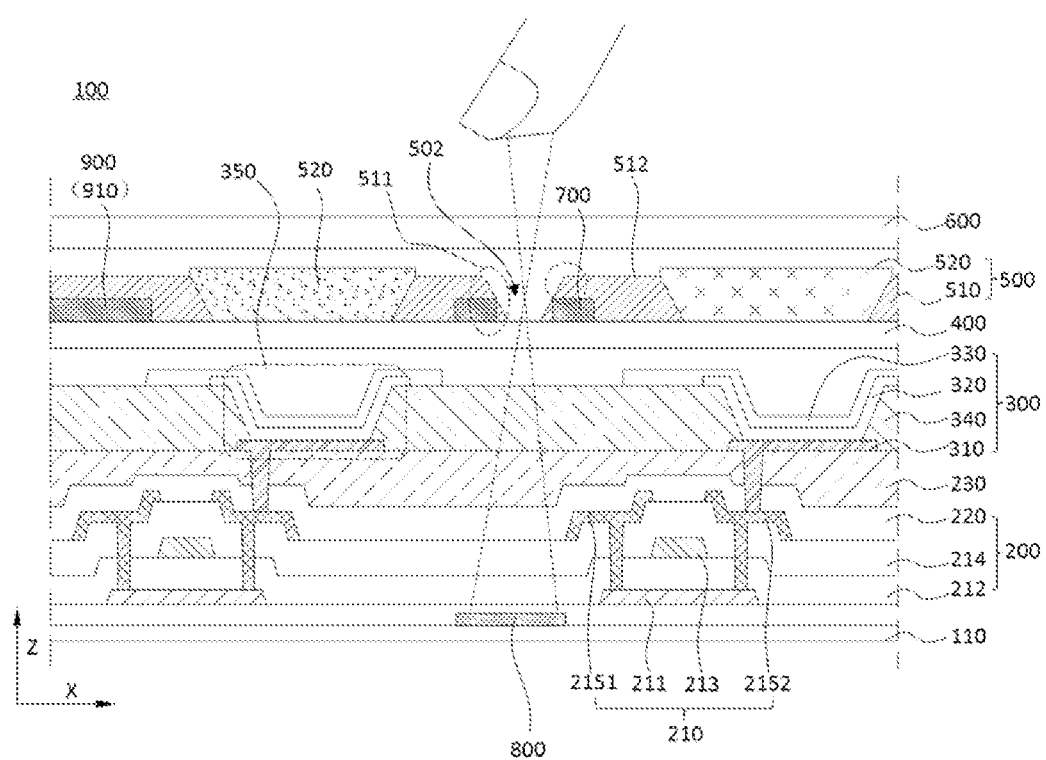
FIG. 6 is a cross sectional view taken along B-B' of the display panel of FIG. 5.

Referring to FIG. 4 to FIG. 6. FIG. 4 is a top view of another display panel according to an embodiment of the present disclosure. FIG. 5 is a partial enlarged view of the display panel of FIG. 4. FIG. 6 is a cross sectional view taken along B-B' of the display panel of FIG. 5. The cross sectional view is perpendicular to the plane where the display panel is located. The similarities between this structure and the other above-mentioned structures will not be described in detail.

Differently, the display panel 100 further includes a touch functional layer 900 located between the display layer 300 and the light-blocking layer 510. The first metal parts 700 are in the same layer with at least one film in the touch functional layer 900.

The touch functional layer 900 is located on a side surface of the encapsulation layer 400 facing away from the display layer 300, and the touch functional layer 900 may include a stacked touch electrode layer and an insulating layer.

The touch functional layer 900 includes a touch drive electrode and a touch sense electrode to form a mutual-capacitance touch functional layer. The touch electrode is directly formed by using the encapsulation layer 400 as a bearing substrate. The touch structure is on-cell.

The touch functional layer 900 includes a first touch electrode layer, an insulating layer and a second touch electrode layer sequentially stacked, so that the mutual-capacitance touch function may be implemented. The materials of the first touch electrode layer and the second touch electrode layer may be metal such as molybdenum, copper or nano-silver, or indium tin oxide (ITO). The insulating layer may include at least one organic insulating layer, at least one inorganic insulating layer, or a combination of at least one organic insulating layer and at least one inorganic insulating layer. The organic insulating layer may include a PET insulating layer, and the inorganic insulating layer may include a silicon nitride insulating layer, a silicon oxide insulating layer or a zirconium oxide insulating layer. The mutual-capacitance touch functional layer may be provided with electrodes in different directions on the two touch electrode layers, and the electrodes on the two touch electrode layers are perpendicular to each other. Because the electrodes on the two touch electrode layers are framed on different surfaces, a capacitor node is formed at an intersection of the two touch electrode layers. One touch electrode layer may be used as a driving layer, and the other touch electrode layer may be used as a sensing layer. When current flows through one wire in the driving layer, if a signal of capacitance change exists outside, the change of the capacitance node on the other wire is caused. The change of the detected capacitance value may be measured through the sensing layer and an electronic loop connected to the sensing layer, and touch positioning is carried out according to the measured sensing signal. A self-capacitance touch electrode may also be provided in embodiments of the present disclosure and will not be described here in detail.

The first metal parts 700 are in the same layer with at least one film in the touch functional layer 900. That is, the first metal parts 700 and films also made from a metal material in the touch functional layer 900 are made from the same material and in the same layer.

The touch electrode layer is made from a metal material, and the first metal parts 700 and the touch electrode layer are made from the same material and in the same layer.

The touch functional layer 900 includes at least one touch electrode layer 910, and the touch electrode layer 910 includes a touch electrode formed by a metal mesh. In an embodiment, meshes of the metal mesh correspond to the light-emitting elements.

The mesh lines of the metal mesh are located in a region covered by the light-blocking layer 510. Therefore, the interference of light reflected by the metal mesh on the display can be avoided, and the electrode pattern can be avoided being visible.

In this structure, the edge definition of pinhole imaging is improved while the number of films and the manufacturing process are not increased. The imaging aperture 502 is formed through the first light-blocking portions 511 of the light-blocking layer 510 of the color filter layer 500. The film in the first metal parts 700 and the film in the touch functional layer 900 which are made from the metal material are made from the same material and in the same layer. An additional light-blocking layer for fingerprint recognition imaging does not need to be added, and a metal layer does not need to be additionally added for providing the first metal parts, which is advantageous for implementing the thinning of the display panel. Moreover, the combination of the touch functional layer 900 and the color filter layer 500 provided by the present disclosure may also ensure that the first metal parts 700 and the touch electrode cannot reflect light, resulting in the damage of the display effect or the pattern visibility.

Figure 7:
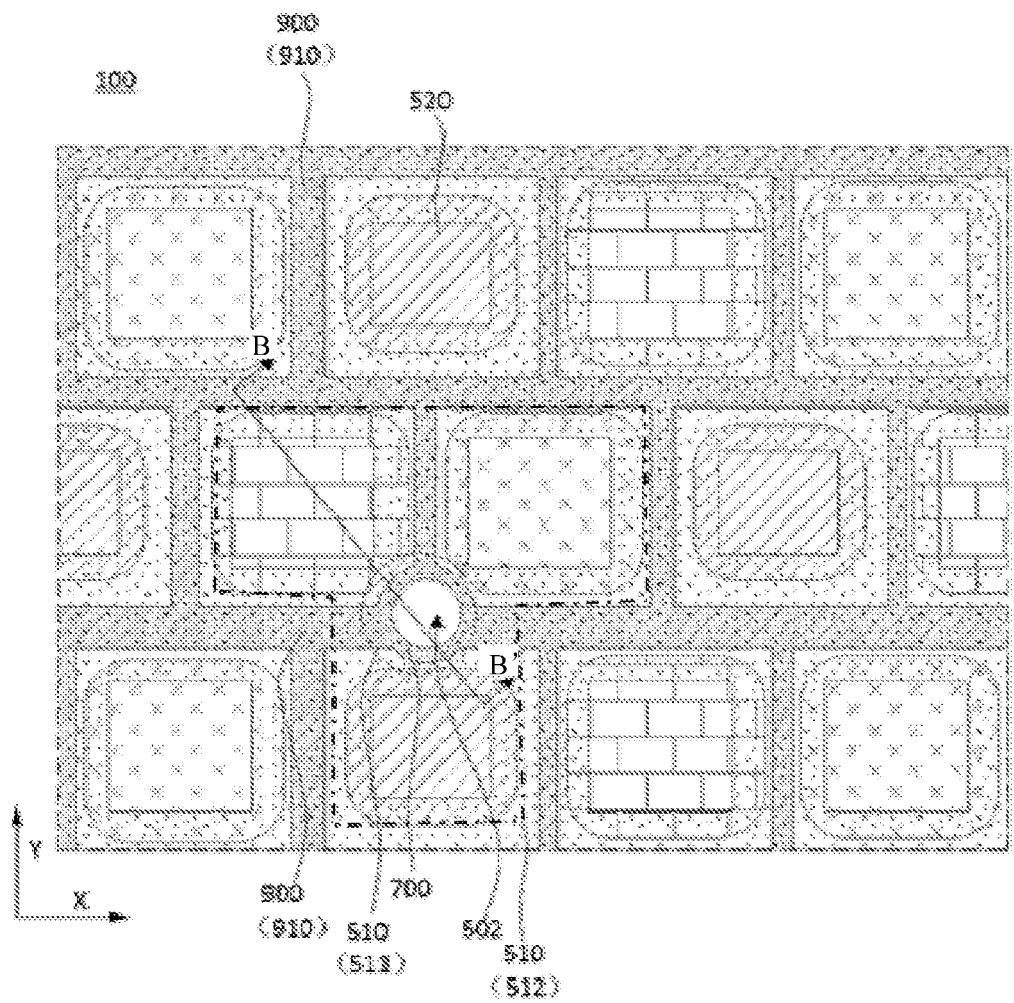
FIG. 7 is another partial enlarged view of the display panel of FIG. 4.

FIG. 7 is another partial enlarged view of the display panel of FIG. 4. The touch functional layer 900 includes at least one touch electrode layer 910, and the touch electrode layer 910 includes a touch electrode formed by a metal mesh. In an embodiment, meshes of the metal mesh correspond to the light-emitting elements.

At least part of the touch electrode 910 is multiplexed as the first metal parts 700. That is, the touch electrode 910 is integrally formed with the first metal parts 700. Thus, the process can be simplified, the cost can be reduced, the touch electrode 910 can be integrated with the first metal parts 700, and the space occupied by the first metal parts 700 can be reduced.

Figure 8:
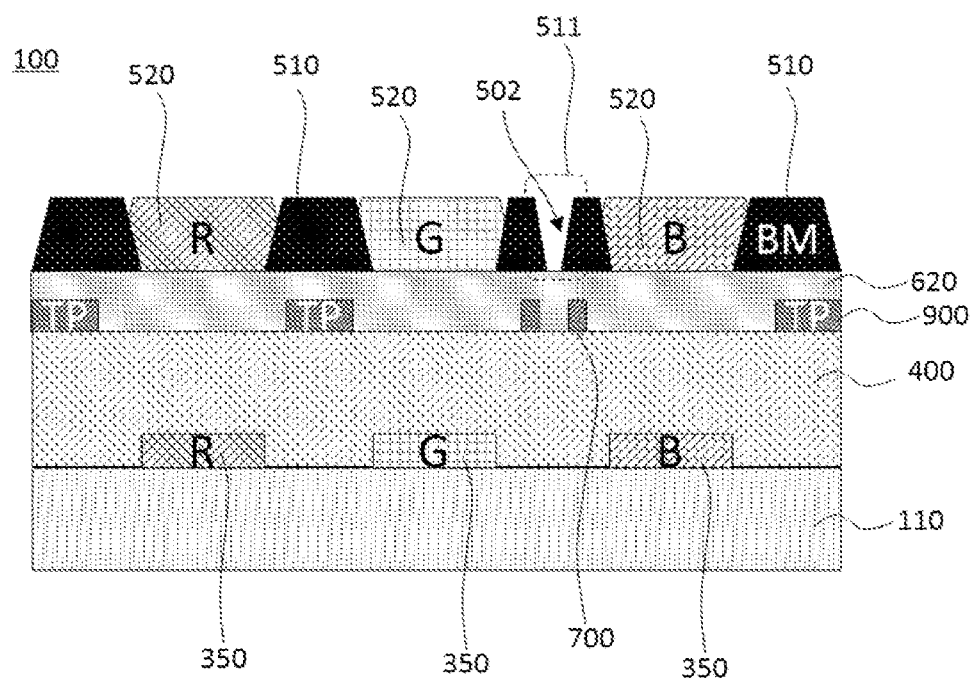
FIG. 8 is another partial cross sectional view taken along A-A' of FIG. 1.

FIG. 8 is another partial cross sectional view taken along A-A' of FIG. 1 and the section is perpendicular to the plane where the display panel is located.

Different from the above mentioned examples, the display panel 100 includes a first planarization layer 620 between the first metal parts 700 and the light-blocking layer 510. In an embodiment, after the touch functional layer 900 is fabricated, the first planarization layer 620 fabricated by an organic insulating material is covered. The color filter layer 500 is then fabricated on the first planarization layer 620. The color filter layer 500 may be attached to the first planarization layer 620 after fabricated on other platforms. The first planarization layer 620 may provide a flat surface for the attachment to facilitate fabrication.

Moreover, the reliability of the first metal layer being multiplexed as the touch electrode can also be improved. Because the materials of the light-blocking layer are conductive, if the first metal layer is part of the touch electrode, short circuits may be caused between different touch electrodes through the light-blocking layer. The structure can avoid stringent requirements on the materials of the light-blocking layer, which will be easier to find.

In all above figures, FIG. 2, FIG. 6, FIG. 8-12, the cross sectional view is perpendicular to the plane where the display panel is located.

The first light-blocking portion 511 is in contact with and covers the first metal part 700. That is, the first metal parts 700 are under the light-blocking layer 510, and the two films are adjacent to each other and in direct contact with each other. Therefore, the situation that other films between the first metal part layer and the first light-blocking portions 511 need masks can be avoided, a mask can be saved, and the manufacturing process can be simplified. The pattern of the first metal part layer and the pattern of the first light-blocking portions are basically consistent, and a space can be provided for leading out signals on the display panel 100. Moreover, the first light-blocking portion 511 is in contact with and covers the first metal part 700, and no gap exists between the light-blocking portion 511 and the first metal part 700, so that the blocking effect can be improved, and the accuracy of imaging of the imaging aperture can be refined.

Figure 9:
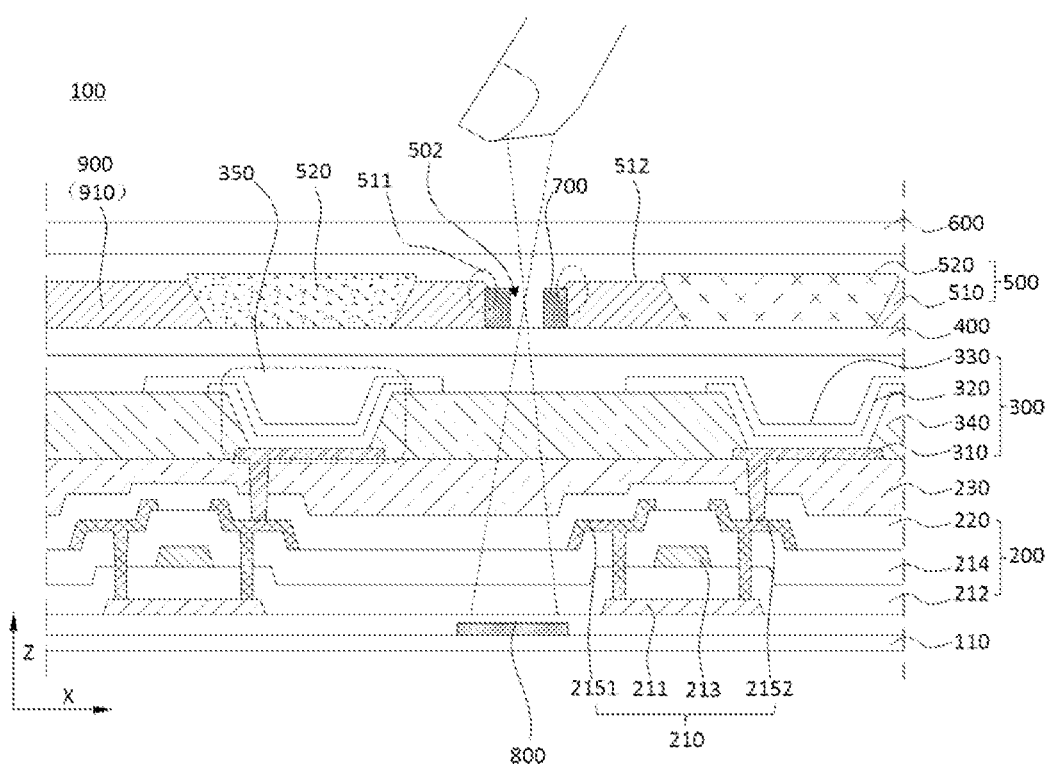
FIGS. 9-12 are cross sectional views of various display panels according to embodiments of the present disclosure.
Figure 11:
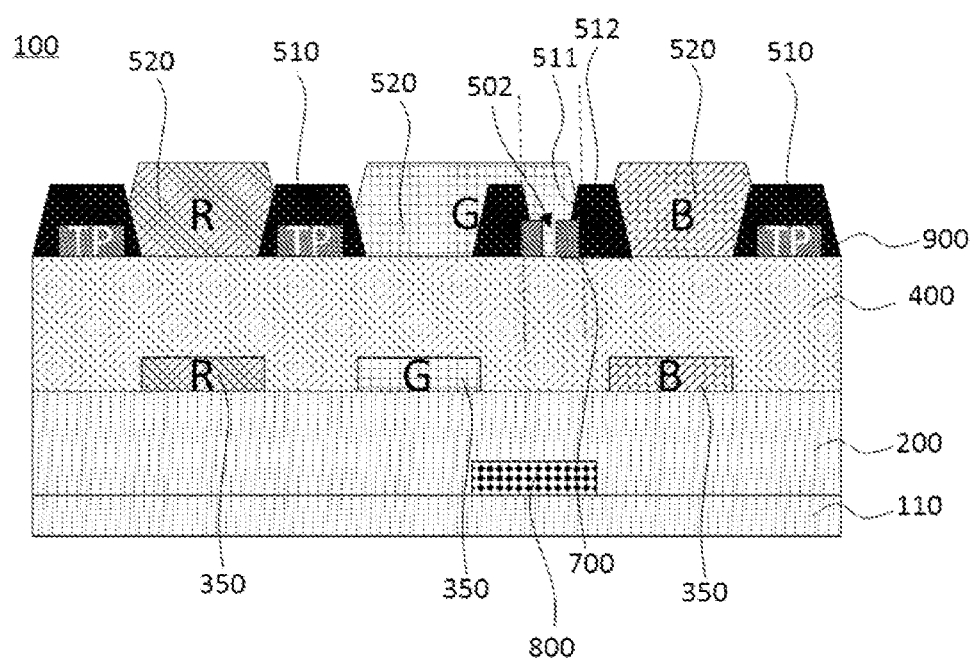

In an embodiment, referring to FIG. 9 or FIG. 11, an edge of the first light-blocking portion 511 where the imaging aperture 502 is located is terminated at the first metal part 700. That is, the first metal part 700 forms a metal edge for the imaging aperture 502.

When the first light-blocking portions 511 of the light-blocking layer 510 are formed, the first metal part 700 may form a dam-like structure to intercept and trap the material of the light-blocking layer 510, causing the material of the light-blocking layer 510 around the imaging aperture 502 to be thickened. In addition, the first metal part 700 can also cushion the first light-blocking portion 511, so that the thickness of the light-tight structure formed by the light-blocking layer 510 around the imaging aperture 502 can be indirectly increased, and the imaging effect of the imaging aperture can be improved.

Figure 10:
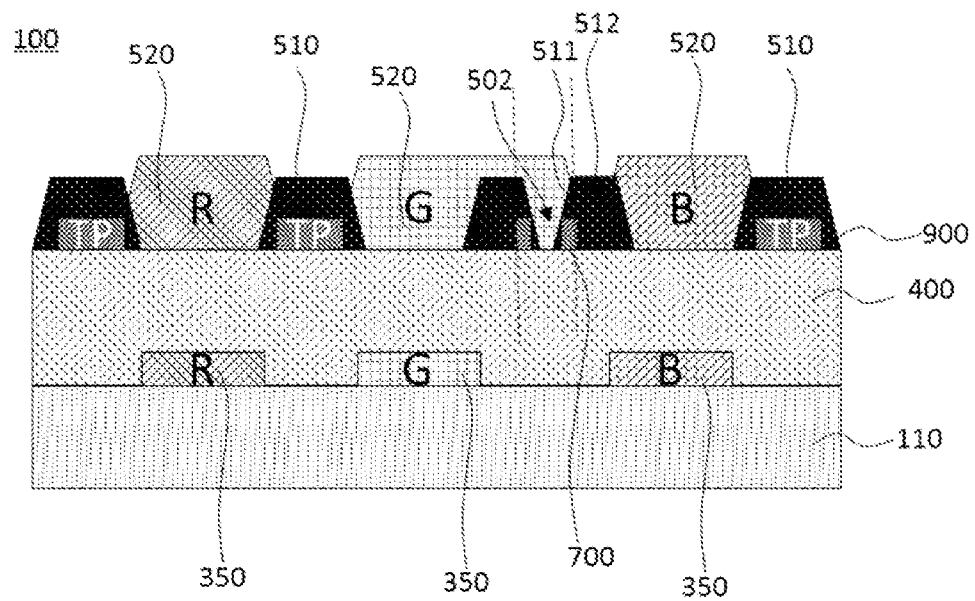
Figure 12:
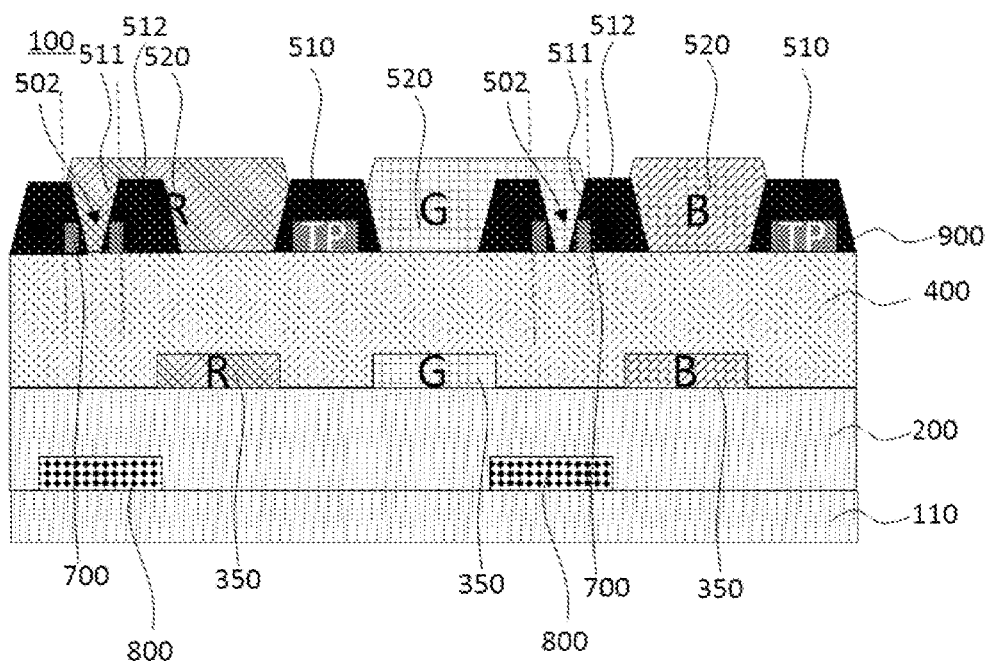

As shown in any of FIG. 10 to FIG. 12, the color filter 520 covers the imaging aperture 502. In an embodiment, the color filter 520 at least partially overlaps the light-blocking layer 510 and overlaps the imaging aperture 502 formed by the first light-blocking portion 511 of the light-blocking layer 510, causing the color filter 520 fills the imaging aperture 502. It should be noted that to ensure that the light transmission of the imaging aperture 502, one imaging aperture 502 is covered by only one color filter 520.

In this structure, light can be ensured to pass through the imaging aperture 502, and the pattern visibility caused by light reflection of the first metal part 700 can be avoided. Even if light reflected by the first metal part 700 from the side of the aperture can be blocked by the color filter 520.

In FIG. 12, at least two imaging apertures 502 are respectively covered by color filters 520 with two different colors. Therefore, images imaged by different imaging apertures 502 are formed by lights of different colors, and interference among the lights transmitted by different imaging apertures 502 is avoided.

In an embodiment, the optical sensor layer 800 detects images presented by imaging apertures 502 covered by color filters 520 with different colors at different times.

In an embodiment, the optical sensor layer 800 includes multiple sensors arranged in an array and in one-to-one correspondence with the imaging apertures 502. In an embodiment, the display panel 100 further includes a control unit (not shown), the control unit controls the light source to emit light of different colors at different times, and the control unit controls a detection unit in correspondence with the imaging aperture 502 filled by the color filter 520 with the color to detect the image presented by the imaging aperture 502. For example, in the first time period, a red light source emits light, and a detection unit in correspondence with an imaging aperture 502 filled by a red color filter captures an image; in the second time period, a green light source emits light, and a detection unit in correspondence with an imaging aperture 502 filled by a green color filter captures an image. The accuracy of light sensing detection is thus increased.

Figure 13:
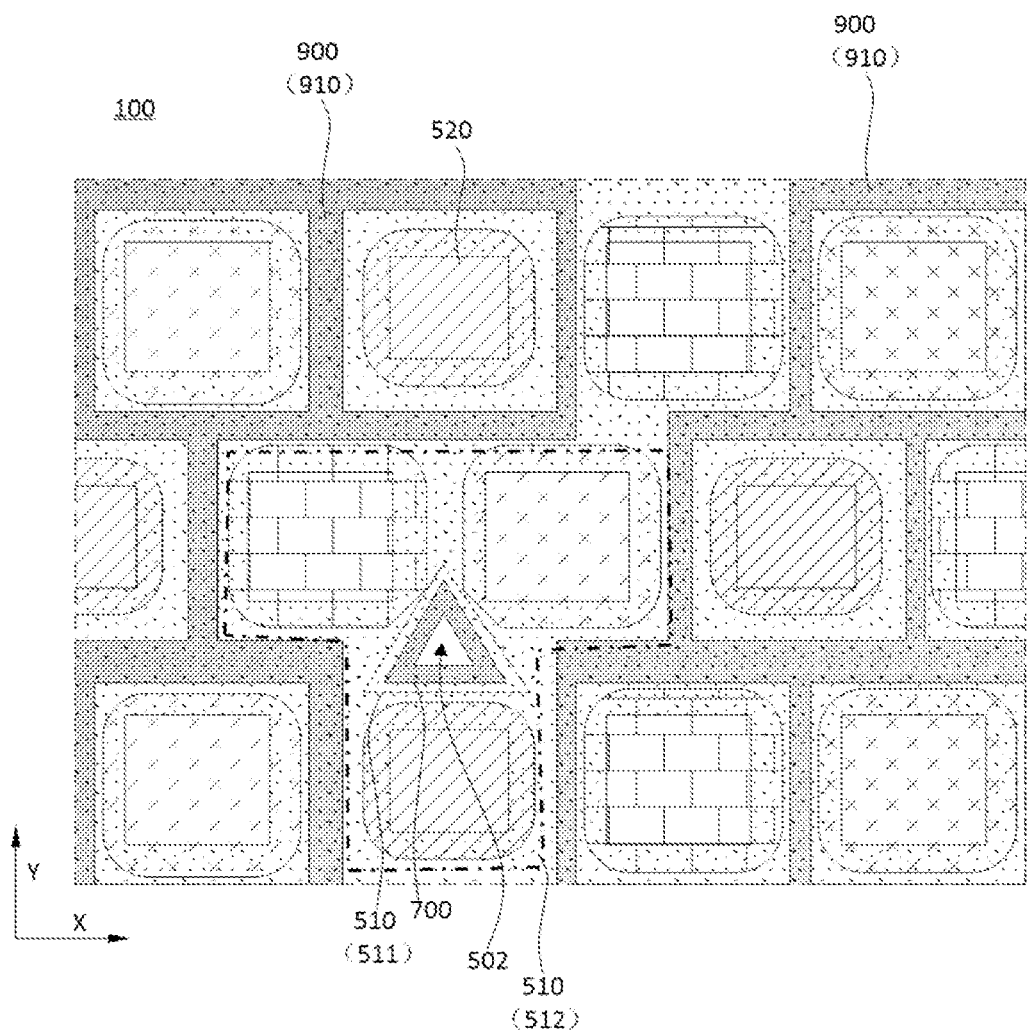
FIG. 13 is a top view of another display panel according to an embodiment of the present disclosure.

FIG. 13 is a top view of another display panel according to another embodiment of the present disclosure. Every three light-emitting elements adjacent to each other in the display panel are arranged in a delta shape. The imaging aperture 502 is located in a middle of the delta shape formed by the three light-emitting elements.

The pixels in the display panel 100 are arranged in the delta shape. That is, the light-emitting elements in the display panel 100 are arranged along a first direction X to form pixel rows, and the pixel rows are arranged along a second direction Y to form a pixel array. Red, green and blue pixels are alternately arranged in the first direction X. Adjacent light-emitting elements (pixels) in the second direction Y are arranged in a staggered arrangement. That is, one light-emitting element is arranged at a position corresponding to the position between two light-emitting elements in the adjacent row of pixels and is different in color from the two pixels. Three adjacent pixels form one pixel unit (as indicted by the region encircled by the dotted box). The three pixels of the one pixel unit are arranged in the delta shape, and one pixel of the one pixel unit is equivalent to one corner of the delta shape. One imaging aperture 502 is located in the middle of the delta shape formed by the three light-emitting elements. That is, the imaging aperture 502 is surrounded by the three pixels of the pixel unit.

The aperture provided by the imaging aperture 502 can be enlarged, the blocking effect on the pixel light emission is relatively small, and the opening of the pixel cannot be compressed while the imaging aperture 502 is provided.

The area of the red pixel of the pixel unit is smaller than pixels with other colors, that is, the area of red color filter is smaller than the area of color filters with other colors. It is limited that the mesh of the red color filter in the light-blocking layer 510 is the smallest.

The red pixel is located at a position that is not adjacent to the other two pixels of the same pixel unit in the first direction X, that is, at a position of the upper "corner" of the delta shape.

Therefore, the space provided with the imaging aperture 502 can be further increased, and the display effect of the pixels can be improved.

Referring to FIG. 13, the imaging aperture 502 is in the shape of a triangle, and an orientation of a vertex angle of the triangle is opposite to the orientation of the delta shape. That is, the bottom side of the triangular imaging aperture 502 is parallel to the first direction X, and the bottom side is adjacent to the pixel of the upper "corner" of the delta shape. The vertex angle of the triangular imaging aperture 502 opposite to the bottom side points a position between two pixels adjacent in the first direction X in the pixel unit.

The pixel design is matched with the shape and position of the imaging aperture, so that the imaging effect and layout effect of the imaging aperture are improved.

It should be understood that the shape here is the shape presented by the top view of the display panel, that is, the shape of the orthographic projection of the component on the substrate.

Referring to FIG. 5 or FIG. 7, the first metal part 700 is a closed pattern surrounding the imaging aperture 502. Thus the light leakage in different directions can be effectively blocked. In addition, it is advantageous for the stability of the structure of the imaging aperture 502 and forming a structure similar to the edge of the imaging aperture 502. In an embodiment, the first metal part 700 is a closed circle surrounding the imaging aperture 502, which is advantageous for the stress release.

Moreover, for any of the above embodiments, the display panel may further include a fingerprint recognition device, and the fingerprint recognition device includes the optical sensor layer 800 described above.

The display panel 100 in the present disclosure may be an organic light-emitting display panel. The light-emitting elements may be multiplexed as the light source of the fingerprint recognition device (the optical sensor layer 800) to ensure that the display panel does not need to provide a separate light source for the fingerprint recognition device, the display panel has a simple structure and a simple layer relationship. Thus, the thin and light design of the display panel is easy to be implemented. Alternatively, the display panel provided by the embodiment of the present disclosure may further include a fingerprint recognition light source (not shown). The fingerprint recognition light source separately provides a light source for the optical sensor layer 800 to ensure that the fingerprint recognition device may have multiple functions. For example, the fingerprint recognition light source may be an infrared light source, to ensure that the fingerprint recognition device can not only recognize fingerprints, but also recognize blood flow conditions of human body and monitor human health.

Figure 14:
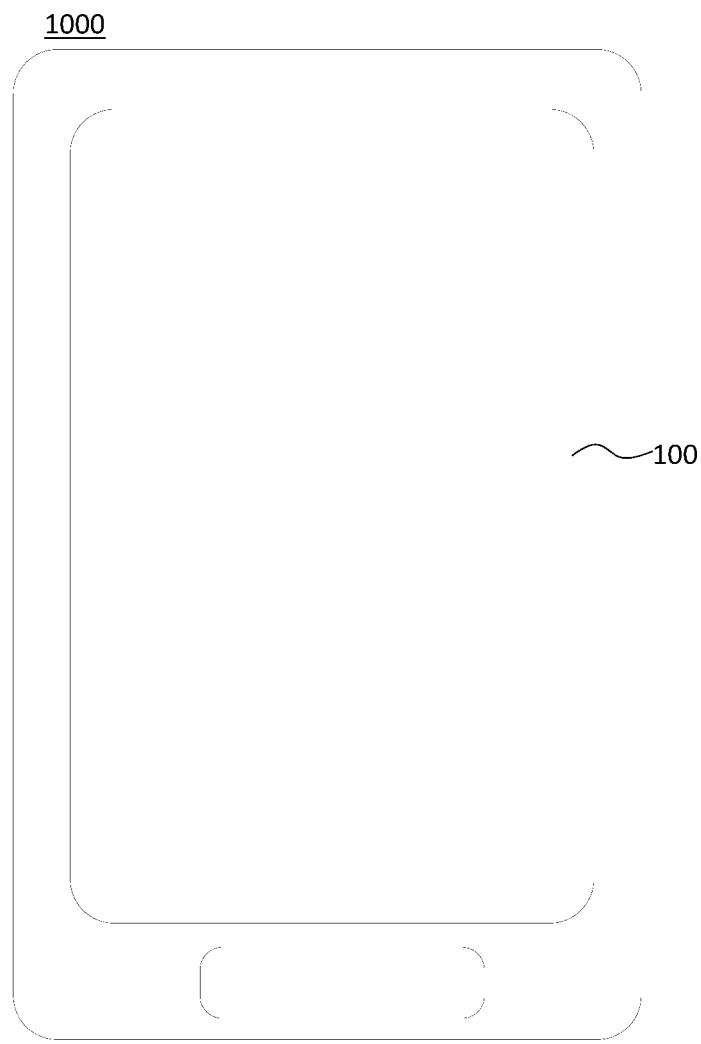
FIG. 14 is a structural diagram of a display device.

FIG. 14 shows the outline 1000 of a mobile phone. It should be understood that the display device 1000 requires a display device 100 with a display function, such as a computer, a television or an in-vehicle display device, which is not limited in the present disclosure. The display device 1000 has the beneficial effects of the display panel 100 provided by the embodiment of the present disclosure. Reference may be made to the detailed description of the display panel 100 in the above embodiments, and these beneficial effects will not be repeated in this embodiment.

What is claimed is:

1. A display panel, comprising:
a substrate having a first surface and a second surface opposing the first surface in a Z-direction;
an array layer disposed on the first surface of the substrate;
a display layer disposed on a side of the array layer facing away from the substrate, wherein the display layer comprises light-emitting elements;
a color filter layer disposed on a side of the display layer facing away from the array layer, wherein the color filter layer comprises a light-blocking layer and color filters, wherein
the color filters are in correspondence with the light-emitting elements, and
the light-blocking layer comprises first light-blocking part and second light-blocking part, wherein at least one imaging aperture is disposed in the first light-blocking part, and the first light-blocking part is located between the second light-blocking part and the at least one imaging aperture;
a protective layer disposed on the color filter layer;
first metal part disposed on a side of the array layer facing away from the substrate, wherein a thickness of a portion of the first light-blocking part that overlaps the first metal part in the Z-direction is less than a thickness of a portion of the second light-blocking part that overlaps the first metal part in the Z-direction; and
an optical sensor layer disposed on a side of the color filter layer facing away from the protective layer and configured to detect light passing through the at least one imaging aperture.

2. The display panel of claim 1, wherein at least part of the first light-blocking part is in contact with and overlaps at least associated part of the first metal part.

3. The display panel of claim 2, wherein an edge of at least part of the first light-blocking part where the adjacent imaging aperture is located is terminated at the at least associated part of the first metal part.

4. The display panel of claim 1, wherein at least one of the color filters overlaps one of the at least one imaging aperture.

5. The display panel of claim 4, wherein
two different imaging apertures overlap with two of the color filters having two different colors.

6. The display panel of claim 5, wherein
the optical sensor layer detects images from imaging apertures overlapped by the color filters with different colors at different times.

7. The display panel of claim 1, wherein
every three light-emitting elements adjacent to each other among the light-emitting elements are arranged in a triangular shape, and one imaging aperture is located in a middle of the triangular shape formed by said three light-emitting elements.

8. The display panel of claim 7, wherein one of the at least one imaging aperture is in a shape of a triangle, wherein an orientation of a vertex angle of the triangle is opposite to an orientation of the triangular shape.

9. The display panel of claim 1, wherein at least part of the first metal part is a closed pattern surrounding a respective one imaging aperture.

10. A display device, comprising:
the display panel of claim 1.

11. A display panel, comprising:
a substrate having a first surface and a second surface opposing the first surface in a Z-direction;
an array layer disposed on the first surface of the substrate;
a display layer disposed on a side of the array layer facing away from the substrate, wherein the display layer comprises light-emitting elements;
a color filter layer disposed on a side of the display layer facing away from the array layer, wherein the color filter layer comprises a light-blocking layer and color filters, wherein
the color filters are in correspondence with the light-emitting elements, and
the light-blocking layer comprises first light-blocking part and second light-blocking part, wherein at least one imaging aperture is disposed in the first light-blocking part, and the first light-blocking part is located between the second light-blocking part and the at least one imaging aperture;
a protective layer disposed on the color filter layer;
a first metal part, wherein a thickness of a portion of the first light-blocking part that overlaps the first metal part in the Z-direction is less than a thickness of a portion of the second light-blocking part that overlaps the first metal part in the Z-direction;
an optical sensor layer disposed on a side of the color filter layer facing away from the protective layer; and
a touch functional layer located between the display layer and the light-blocking layer;
wherein the first metal part is disposed in a same layer as the touch functional layer.

12. The display panel of claim 11, wherein
the touch functional layer comprises at least one touch electrode layer; in a case where the touch functional layer comprises one touch electrode layer, the one touch electrode layer comprises a touch electrode formed by a metal mesh, and at least part of the one touch electrode is multiplexed as the first metal part; and in a case where the touch functional layer comprises touch electrode layers, at least one of the touch electrode layers comprises a touch electrode formed by a metal mesh, and at least part of the at least one of the touch electrodes is multiplexed as the first metal part.

13. The display panel of claim 12, wherein mesh lines of the metal mesh are disposed in a region covered by the light-blocking layer.

14. A display panel, comprising:
a substrate having a first surface and a second surface opposing the first surface in a Z-direction;
an array layer disposed on the first surface of the substrate;
a display layer disposed on a side of the array layer facing away from the substrate, wherein the display layer comprises light-emitting elements;
a color filter layer disposed on a side of the display layer facing away from the array layer, wherein the color filter layer comprises a light-blocking layer and color filters, wherein
the color filters are in correspondence with the light-emitting elements, and
the light-blocking layer comprises first light-blocking part and second light-blocking part, wherein at least one imaging aperture is disposed in the first light-blocking part, and the first light-blocking part is located between the second light-blocking part and the at least one imaging aperture;
a protective layer disposed on the color filter layer;
first metal part disposed on a side of the array layer facing away from the substrate, wherein a top surface of a portion of the first light-blocking part that overlaps the first metal part in the Z-direction is a slope surface; and
an optical sensor layer disposed on a side of the color filter layer facing away from the protective layer and configured to detect light passing through the at least one imaging aperture.

15. The display panel of claim 14, further comprising a touch functional layer located between the display layer and the light-blocking layer;
wherein the first metal part is disposed in a same layer as the touch functional layer.

16. The display panel of claim 15, wherein
the touch functional layer comprises at least one touch electrode layer; in a case where the touch functional layer comprises one touch electrode layer, the one touch electrode layer comprises a touch electrode formed by a metal mesh, and at least part of the one touch electrode is multiplexed as the first metal part; and in a case where the touch functional layer comprises touch electrode layers, at least one of the touch electrode layers comprises a touch electrode formed by a metal mesh, and at least part of the at least one of the touch electrodes is multiplexed as the first metal part.

17. The display panel of claim 16, wherein mesh lines of the metal mesh are disposed in a region covered by the light-blocking layer.

18. The display panel of claim 14, wherein at least part of the first light-blocking part is in contact with and overlaps at least associated part of the first metal part.

19. The display panel of claim 18, wherein an edge of at least part of the first light-blocking part where the adjacent imaging aperture is located is terminated at the at least associated part of the first metal part.

20. A display device, comprising:
the display panel of claim 14.

* * * * *